United States Patent [19]
Forrest et al.

[11] Patent Number: 5,998,803
[45] Date of Patent: Dec. 7, 1999

[54] ORGANIC LIGHT EMITTING DEVICE CONTAINING A HOLE INJECTION ENHANCEMENT LAYER

[75] Inventors: Stephen Forrest; Paul Burrows, both of Princeton, N.J.; Mark E. Thompson, Anaheim Hills, Calif.; Vladimir Bulovic, Metuchen, N.J.

[73] Assignees: The Trustees of Princeton University, Princeton, N.J.; The University of Southern California, Los Angeles, Calif.

[21] Appl. No.: 08/865,491

[22] Filed: May 29, 1997

[51] Int. Cl.$^6$ .............................. H01L 35/24; H01J 1/62
[52] U.S. Cl. ........................ 257/40; 257/103; 313/504; 313/506
[58] Field of Search ................. 257/40, 94, 96, 257/103; 313/503, 504, 506

[56] References Cited

U.S. PATENT DOCUMENTS

| | | | |
|---|---|---|---|
| 4,381,886 | 5/1983 | Yokokura et al. | 349/123 |
| 4,611,385 | 9/1986 | Forrest et al. | 257/40 |
| 4,720,432 | 1/1988 | VanSlyke et al. | 313/504 |
| 4,950,950 | 8/1990 | Perry et al. | 313/504 |
| 5,364,654 | 11/1994 | Hosokawa et al. | 427/66 |
| 5,458,977 | 10/1995 | Hosokawa et al. | 313/504 |
| 5,539,100 | 7/1996 | Wasielewski et al. | 524/88 |

FOREIGN PATENT DOCUMENTS

| | | |
|---|---|---|
| 461542 B1 | 12/1991 | European Pat. Off. . |
| 3128393 | 2/1983 | Germany . |
| 01233283 | 9/1989 | Japan . |
| 02189524 | 7/1990 | Japan . |
| 03179427 | 8/1991 | Japan . |
| 07110500 | 4/1995 | Japan . |
| 8504985 | 11/1985 | WIPO . |
| PCT/US95/ 15790 | 12/1995 | WIPO . |

OTHER PUBLICATIONS

Tang et al., "Organic electroluminescent diodes", Appl. Phys. Lett. 51, p. 913 (1987), Sep. 1987.

Baigent et al., "Conjugated polymer light–emitting diodes on silicon substrates", Appl. Phys. Lett 65, p. 2636 (1994). Nov. 1994.

Kim et al., "Silicon Compatible Organic Light Emitting Diode", J. Lightwave Technology, vol. 12, p. 2107 (1994), Dec. 1994.

Gu et al., "Transparent light–emitting devices", Nature, vol. 380, p. 29 (1996), Mar. 1996.

Gulović et al., "Transparent organic light emitting devices", Appl. Phys. Lett. 68, p. 2606 (1996), May 1996.

VanSlyke et al, "Organic electroluminescent devices with improved stability", Appl. Phys. Lett. 69, p. 2160 (1996), Oct. 1996.

Burrow, et al., "Electroluminescence from trap–limited current transport in vacuum deposited organic light emitting devices", Appl. Phys. Lett. 64, p. 2285 (1994), Apr. 1994.

Bulović et al., "Study of localized and extended excitons in 3,4,9,10–perylenetetracarboxylic dianhydride (PTCDA) I. Spectroscopic properties of thin films and solutions",Chem. Phys. 210, pp. 1–12 (1996).

(List continued on next page.)

*Primary Examiner*—Minh Loan Tran
*Attorney, Agent, or Firm*—Kenyon & Kenyon

[57] ABSTRACT

The present invention is directed to organic light emitting devices comprised of a heterostructure for producing electroluminescence, wherein the heterostructure includes a hole injection enhancement layer between a hole transporting layer and an indium tin oxide anode layer. The hole injection enhancement layer may be comprised of 3,4,9,10-perylenetetracarboxylic dianhydride (PTCDA), bis(1,2,5-thiadiazolo)-p-quinobis(1,3-dithiole) (BTQBT), or other suitable, rigid organic materials. The present invention is further directed to methods of fabricating such devices.

17 Claims, 5 Drawing Sheets

OTHER PUBLICATIONS

Bulović et al., "Study of localized and extended excitons in 3,4,9,10–perylenetetracarboxylic dianhydride (PTCDA) II. Photocurrent response at low electric fields", Chem. Phys. 210, pp. 13–25 (1996).

So et al., "Organic–on–Inorganic Semiconductor Photodetector", IEEE Transactions on Electron Devices, vol. 36, No. 1, 66, (1989) Jan. 1989.

Shen et al., "Temperature Dependence of Current Transport and Electroluminescence in Vacuum Deposited Organic Light Emitting Devices", Appl. Phys. vol. 35, p. 401 (1996). Mar. 1996.

Burrows et al., "Relationship between electroluminescence and current transport in organic heterojunction light–emitting devices", Appl. Phys. 79, p. 7991, (1996)., May 1996.

Hosokawa et al., "Transient behavior of organic thin film electroluminescence", Appl. Phys. Lett. 60, p. 1220 (1992). Mar. 1992.

Kepler et al., "Electron and hole mobility in tris(8–hydroxyquinolinolato–N1,08) aluminum", Appl. Phys. Lett. 66, p. 3618 (1995)., Jun. 1995.

Hung et al., "Enhanced electron injection in organic electroluminescence devices using an Al/LiF electrode", Appl. Phys. Lett. 70, p. 152 (1997).Jan. 1997.

Garbuzov et al., "Photoluminescence efficiency and absorption of aluminum–tris–quinolate ($Alq_3$) thin films", Chem. Phys. Lett. 249, pp. 433–437 (1996). Feb. 1996.

Burrows et al., "Color–Tunable Organic Light Emitting Devices",IEEE Lasers and Electro–Optics Society, Annual Meeting, vol. 1 82 (1996). Nov. 1996.

Forrest et al., "Organic–on–inorganic semiconductor contact barrier diodes. II. Dependence organic film and metal contact properties", J. Appl. Phys. 56, p. 543 (1984). Jul. 1984.

Kido et al., "Multilayer White Light–Emitting Organic Electroluminescent Device", Science vol. 267, p. 1332 (1995). Mar. 1995.

Cheng et al., "Depletion and enhancement mode $In_{0.53}Ga_{0.47}As/InP$ junction field–effect transistor with a p+–InGaAs confinement layer", Appl. Phys. Lett. 46, p. 885 (1985). May 1985.

Blouke et al., "Ultraviolet downconverting phosphor for use with silicon CCD imagers", Appl. Optics vol. 19, No. 19, p. 3318 (1980)., Oct. 1980.

Wu et al., "Integrated three–color organic light–emitting devices", Appl. Phys. Lett. 69, p. 3117 (1996)., Nov. 1996.

Forrest et al., "Organic emitters promise a new generation of displays", Laser Focus World, p. 99 (1995). Feb. 1995.

Rompf et al., "Deposition and characterisation of crystalline organic semiconductors for photonic devices", Materials Science and Technology vol. 11, p. 845(1995). Aug. 1995.

ORGANIC LIGHT EMITTING DEVICE CONTAINING A HOLE INJECTION ENHANCEMENT LAYER

GOVERNMENT RIGHTS

This invention was made with Government support under Contract No. F33615-94-1-1414 awarded by DARPA. The government has certain rights in this invention.

FIELD OF THE INVENTION

The present invention is directed to organic light emitting devices comprised of a heterostructure having a hole injection enhancement layer between the hole transporting layer and the ITO anode layer.

BACKGROUND OF THE INVENTION

Organic light emitting devices (OLEDs) are light emitting devices that are comprised of several layers, in which one of the layers is comprised of an organic material that can be made to electroluminesce by applying a voltage across the device, C. W. Tang et al., Appl. Phys. Lett 51, 913 (1987). Certain OLEDs have been shown to have sufficient brightness, range of color and operating lifetimes for use as a practical alternative technology to LCD-based full color flat-panel displays (S. R. Forrest, P. E. Burrows and M. E. Thompson, Laser Focus World, Feb. 1995). Furthermore, since many of the organic thin films used in such devices are transparent in the visible spectral region, they allow for the realization of a completely new type of display pixel in which the red (R), green (G), and blue (B) emission layers are placed in a vertically stacked geometry to provide a simple fabrication process, a small R-G-B pixel size, and a large fill factor.

A transparent OLED (TOLED) which represents a significant step toward realizing high resolution, independently addressable stacked R-G-B pixels has been reported in International Patent Application No. PCT/US95/15790. This TOLED had greater than 71% transparency when turned off and emitted light from both top and bottom device surfaces with high efficiency (approaching 1% quantum efficiency) when the device was turned on. The TOLED used transparent indium tin oxide (ITO) as the hole-injecting electrode and a Mg-Ag-ITO layer for electron-injection. A device was disclosed in which the Mg-Ag-ITO electrode was used as a hole-injecting contact for a second, different color-emitting OLED stacked on top of the TOLED. Each device in the stacked OLED (SOLED) was independently addressable and emitted its own characteristic color through the transparent organic layers, the transparent contacts and the glass substrate, allowing the device to emit any combination of color that could be produced by varying the relative output of the red and blue color-emitting layers.

Thus, publication of PCT/US95/15790 provided the disclosure of an integrated OLED where both intensity and color could be independently varied and controlled with external power supplies in a color tunable display device. As such, PCT/US95/15790 illustrates a principle for achieving integrated, full color pixels that provide high image resolution, which is made possible by the compact pixel size. Furthermore, relatively low cost fabrication techniques, as compared with prior art methods, may be utilized for making such devices.

In such a stacked structure, one electrode layer is provided at the bottom of the SOLED stack and a further electrode layer is provided between each of the OLEDs in the stack and on top of the uppermost OLED in the stack. The bottom electrode layer is typically coupled to a ground reference and the intermediate and top electrode layers are coupled to either a positive or negative driving voltage.

With only one electrode layer being provided in the SOLED for coupling to a ground reference and with only one additional electrode layer being provided for each OLED in the stack, the problem arises of driving each of the OLEDs in the stack independently of each other. There is therefore a need for a means of driving such a configuration of stacked OLEDs or for alternative configurations of stacked OLEDs, such as disclosed in co-pending application having Ser. No. 08/792,050, filed Feb. 3, 1997.

Devices whose structure is based upon the use of layers of organic optoelectronic materials generally rely on a common mechanism leading to optical emission. Typically, this mechanism is based upon the radiative recombination of a trapped charge. Specifically, devices constructed along the lines discussed above comprise at least two thin organic layers separating the anode and cathode of the device. The material of one of these layers is specifically chosen based on the material's ability to transport holes (the "hole transporting layer") and the material for one of the other layers is specifically selected according to its ability to transport electrons (the "electron transporting layer"). With such a construction, the device can be viewed as a diode with a forward bias when the potential applied to the anode is higher than the potential applied to the cathode. Under these bias conditions, the anode injects holes (positive charge carriers) into the hole transporting layer, while the cathode injects electrons into the electron transporting layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. Recombination of this short-lived state may be visualized as an electron dropping from its conduction potential to a valence band, with relaxation occurring, under certain conditions, preferentially via a photoemissive mechanism. Under this view of the mechanism of operation of typical thin-layer organic devices, the electroluminescent layer comprises a luminescence zone receiving mobile charge carriers (electrons and holes) from each electrode.

The materials that are responsible for producing the electroluminescent emission are frequently incorporated into the OLED such that they also serve as the electron transporting layer of the OLED. Such devices are referred to as having a single heterostructure. However, alternatively, the electroluminescent material may be present in a separate emissive layer between the hole transporting layer and the electron transporting layer in what is referred to as a double heterostructure.

In addition to having the emissive material present as the primary material in the electron transporting layer, the emissive material may also be present as a dopant that is contained within a host material. Materials that are present as host and dopant are selected so as to have a high level of energy transfer between the host and dopant materials. In addition, these materials need to be capable of producing acceptable electrical properties for the OLED. Furthermore, such host and dopant materials are preferably capable of being incorporated into the OLED using starting materials that can be readily incorporated into the hole transporting layer or electron transporting layer of an OLED using convenient fabrication techniques.

Demonstration of efficient electroluminescence from vacuum deposited molecular organic light emitting devices has generated interest in their potential application for emissive flat panel displays. To be useful in low cost, active matrix displays, device structures which are integratable with pixel electronics need to be demonstrated. A conventional OLED is grown on a transparent anode such as ITO, and the emitted light is viewed through the substrate, complicating integration with electronic components such as silicon-based display drivers. It is therefore desirable to develop an OLED with emission through a top, transparent contact. A surface-emitting polymer-based OLED grown on silicon with a transparent ITO and a semitransparent Au or Al top anode has been demonstrated, D. R. Baigent, et al., *Appl. Phys. Lett.* 65, 2636 (1994); H. H. Kim, et al., *J. Lightwave Technol.* 12, 2107 (1994).

A similar integration of molecular OLEDs with silicon was achieved using a tunneling $SiO_2$ interface, Kim et al. The tunneling interface, however, increases the device operating voltage, and can be avoided in structures such as for the recently reported transparent TOLEDs, V. Bulovic, et al., *Nature* 380, 29 (1996). G. Gu, Et al., *Appl. Phys. Lett.* 68, 2606 (1996), which can, in principle, be grown on a silicon substrate. The TOLED anode, however, forms the electrode contact which is in direct contact with the substrate, "the bottom contact", whereas for display drivers employing n-channel field effect transistors (NFETs), such as amorphous silicon NFETs, it would be desirable for the bottom contact of the OLED to be the cathode. This would require fabricating inverted OLEDs (IOLEDs), that is, devices in which the order of placing the sequence of layers onto the substrate is reversed. For example, for a single hererostructure OLED, the electron-injecting cathode layer is deposited onto the substrate, the electron transporting layer is deposited on the cathode, the hole transporting layer is deposited on the electron transporting layer and the hole-injecting anode layer is deposited on the hole transporting layer. Fabrication of IOLEDs would, thus, require that the ITO anode be sputter-deposited on relatively fragile hold-conducting organic thin film. Such sputter-deposition of the ITO can result in unacceptable degradation of the device operating characteristics.

It would be desirable if the hole injection characteristics of thge hole injecting layer could be improved. It has been shown that CuPc can serve as an efficient hole injection layer in conventional OLEDs, S. A. VanSlyke et al., *Appl. Phys. Lett* 69, 2160 (1996) and U.S. Pat. No. 4,720,432 and it had previously been established that PTCDA is an efficient hole transporting layer, P. E. Burrows et al., *Appl. Phys. Lett.* 64, 2285 (1994), V. Bulovic et al., *Chem. Phys.* 210, 1 (1996); and V. Bulovic et al. *Chem. Phys.* 210, 13 (1996); respectively. Furthermore, the use of PTCDA in a photodetector structure with an ITO electrode deposited on the film surface, F. F. So et al., *IEEE.Trans. Electron. Devices* 36, 66 (1989), has previously demonstrated that this material can withstand sputter-deposition of ITO with minimal degradation to its conducting properties.

SUMMARY OF THE INVENTION

The present invention is directed to OLEDs that comprise a heterostructure for producing electroluminescence wherein the heterostructure includes a hole injection enhancement layer between the hole transporting layer and the ITO anode layer.

As examples of preferred embodiments of the subject invention, the hole injection enhancement layer may be 3,4,9,10-perylenetetra-carboxylic dianhydride (PTCDA) or related arylene-based compounds.

One of the features of the present invention is that the crystalline perylene-based layer may be used in IOLEDs to not only protect the underlying hole transporting material from damage incurred during sputter deposition of the ITO anode, that is, as a protective cap layer (PCL), but may also serve as a hole injection enhancement layer (HIEL).

In addition, the present invention is directed to a vacuum deposition method for preparing a single or double heterostructure in which a hole injection enhancement layer is deposited between the hole transporting layer and the ITO anode layer.

DETAILED DESCRIPTION OF PREFERRED EMBODIMENTS

The present invention will now be described in detail for specific preferred embodiments of the invention, it being understood that these embodiments are intended only as illustrative examples and the invention is not to be limited thereto.

The present invention is directed to substantially any type of OLED structure in which a hole injection enhancement layer is present between the hole transporting layer and the anode layer for a heterostructure that is used for producing electroluminescence. In particular, the present invention is directed toward OLEDs which make use of the unecpected discovery that by fabricating inverted OLEDs containing materials that function as a protective cap layer for reducing ITO sputtering damage to the underlying organic layers, enhanced hole injection efficiency properties may be observed for OLEDs containing such a layer. The enhanced hole injection efficiency is characterized by having a higher injected current at a given forward bias, and/or a higher maximum current before device failure. A "hole injection enhancement layer" is, thus, a layer that may be characterized as a layer that produces a current that is at least about 10% higher, typically about 50–100% higher or still higher, than a similar device that lacks such an additional layer. Such layers are believed to provide improved matching of the energy levels of the adjacent layers in a manner that results in enhancement of hole injection.

Figure 1:
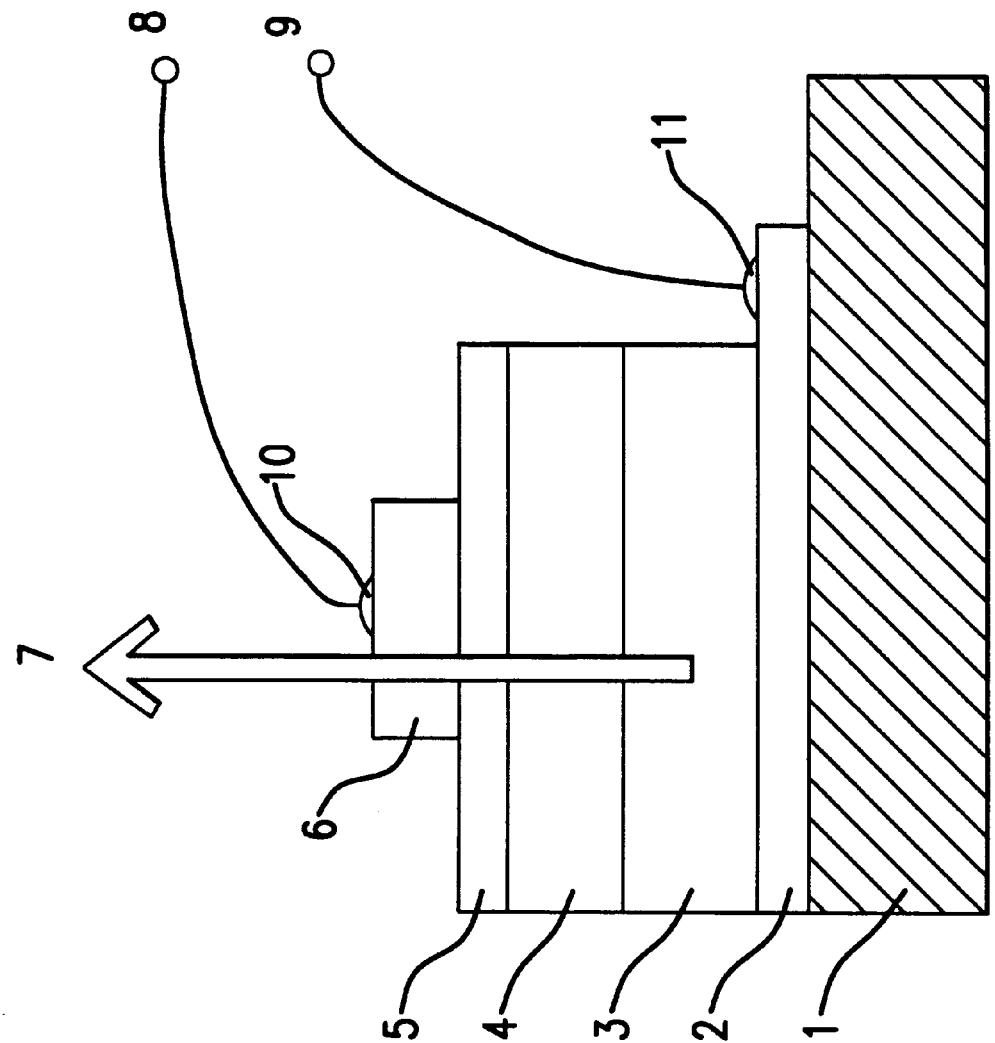
FIG. 1 shows a representative IOLED for a single heterostructural device.

As used herein, the term "heterostructure for producing electroluminescence" refers to a heterostructure that includes, for a single heterostructure such as shown in FIG. 1, a substate 1, an electron-injecting cathode layer 2 in contact with the substate, an electron transporting layer 3 in contact with the cathode layer, a hole transporting layer 4 in contact with the electron transporting layer, a hole injection enhancement layer 5 in contact with the hole transporting layer, and an ITO anode layer 6 in contact with the hole injection enhancement layer. Electrical contacts 10 and 11 can be used to apply a voltage across the heterostructure by connecting points 8 and 9 to a power supply. Electroluminescence is produced by the emissive layer of the heterostructure when a voltage of proper polarity is applied across the heterostructure. In a preferred embodiment of the present invention in which the substrate is an opaque silicon-based driver circuit, electroluminescence is produced through the top of the heterostructure, as illustrated by the large arrow 7.

Alternatively, if a double heterostructure is used to produce electroluminescence, a separate emissive layer (not shown in FIG. 1) is included between the hole transporting layer and the electron transporting layer. If the heterostructure is included as part of a stacked IOLED, one or both of the electrodes of an individual heterostructure may be in contact with an electrode of an adjacent heterostructure.

The hole injection enhancement layer may be formed, for example, by deposition of 3,4,9,10-perylenetetracarboxylic dianhydride (PTCDA):

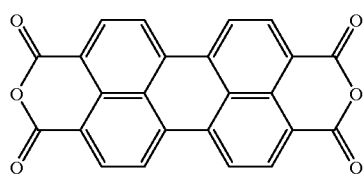

bis(1,2,5-thiadiazolo)-p-quinobis(1,3-dithiole) (BTQBT), or other suitable, rigid organic materials, such as shown by the following compounds:

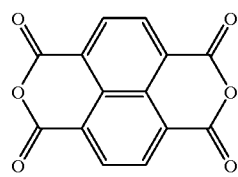

1,4,5,8-naphthalenetetracarboxylic dianhydride (NTCDA);

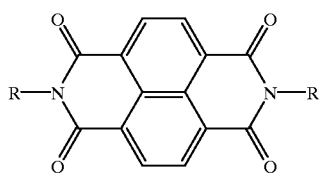

where R=H, alkyl or aryl;

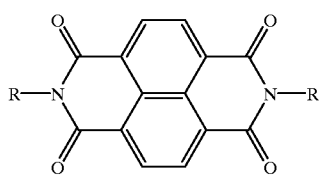

where R=H, (1,4,5,8-naphthalenetetracarboxdiimide);

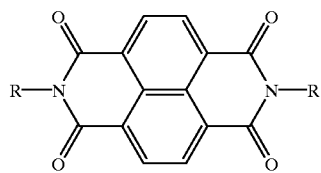

where R=CH$_3$, (N,N'-dimethyl-1,4,5,8-naphthalenetetracarboxdiimide);

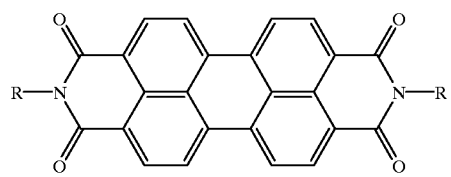

where R=H, alkyl or aryl;

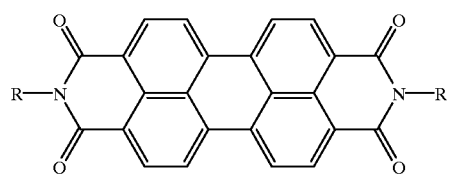

where R=H, (3,4,9,10-perylenetetracarboxylic dimide);

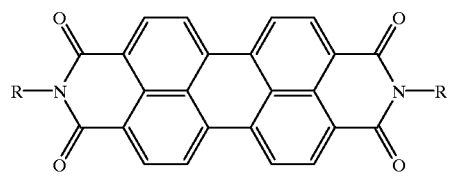

where R=CH$_3$, (N,N'-dimethyl-3,4,9,10-perylenetetracarboxylic diimide);

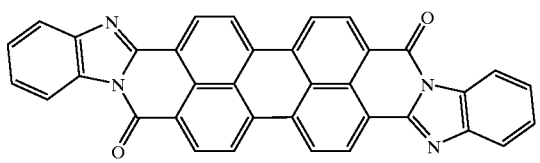

having a CA index name, bisbenzimidazo[2,1-a:1',2'-b'] anthra[2,1,9-def:6,5,10-d'e'f']diisoquinoline-10,21-dione;

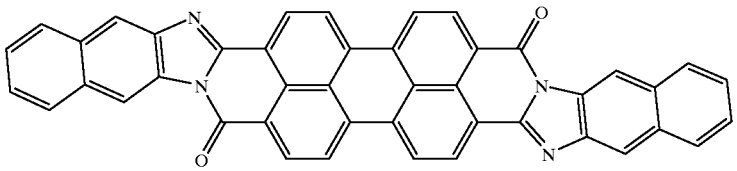

having a CA index name, bisnaphth[2',3':4,5]imidazo[2,1-a:2',1'a']anthra[2,1,9-def:6,5,10-d'e'f']diisoquinoline-10,21-dione;

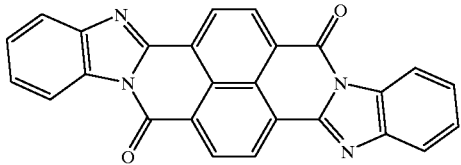

having a CA index name, bisbenzimidazo[2,1-b:2',1'-i]benzo[lmn][3,8]phenanthroline-8,1-dione;

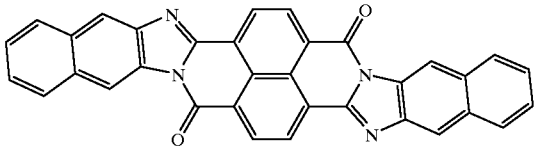

having a CA index name, benzo[lmn]bisnaphth[2',3':4,5]imidazo[2,1-b:2'1'-i][3,8]phenanthroline-9,20-dione.

A substituted derivative of any one of these compounds, or family of compounds, may also be used while remaining within the scope and spirit of the present invention.

The single or double heterostructures, as referred to herein, are intended solely as examples for showing how an OLED embodying the present invention may be fabricated without in any way intending the invention to be limited to the particular sequence or order of making the layers shown. For example, a single heterostructure typically includes a substrate which may be opaque or transparent, rigid or flexible, and/or plastic, metal or glass; a first electrode, which is typically a high work function, hole-injecting metal anode layer, for example, an indium tin oxide (ITO) anode layer; a hole transporting layer; an electron transporting layer; and a second electrode layer, for example, a low work function, electron-injecting, metal cathode layer of a magnesium-silver alloy, (Mg:Ag) or of a lithium-aluminum alloy, (Li:Al). The heterostructures of the present invention include a hole injection enhancement layer between the hole transporting layer and the ITO anode layer.

When the OLED or IOLED is comprised of a double heterostructure having an additional layer of emissive material between the hole transporting and electron transporting layers, this additional layer may be referred to as a "separate emissive layer" so as to distinguish it from the electron transporting layer of a single heterostructure that functions both as the electron transporting layer as well as the emissive layer that produces the electroluminescence. The term "emissive layer" as used herein, thus, may refer either to the emissive, electron transporting layer of a single heterostructure or the separate emissive layer of a double heterostructure.

Although not limited to the thickness ranges recited herein, the substrate (element 1 in FIG. 1) may be as thin as 10 $\mu$, if present as a flexible plastic or metal foil substrate, or substantially thicker if present as a rigid, transparent or opaque, substrate or if the substrate is comprised of a silicon-based display driver; the ITO anode layer may be about 500 Å (1 Å=$10^{-8}$ cm) to greater than about 4000 Å thick; the hole transporting layer about 50 Å to greater than about 1000 Å thick; the separate emissive layer of a double heterostructure about 50 Å to about 200 Å thick; the electron transporting layer about 50 Å to about 1000 Å thick; and the metal cathode layer about 50 Å to greater than about 100 Å thick, or substantially thicker if the cathode layer includes a protective silver layer and is opaque. The hole injection enhancement layer may be from about 10 Å to about 500 Å thick.

In one of the preferred embodiments, the cathode is deposited as the bottom layer on the substrate onto which the inverted OLED is deposited. Such an inverted OLED has the advantage that it can be fabricated entirely from vacuum-deposited molecular organic materials as distinct, for example, from OLEDs in which some of the layers are comprise of polymeric materials, which cannot be readily deposited using vacuum deposition techniques. While a protective layer was typically not necessary in inverted polymer-containing OLEDs since the glass transition temperature ($T_g$) of polymer materials is typically much higher and, thus, more resistant to damage induced by ITO sputtering, than the $T_g$ of molecular (non-polymeric) organic materials, such inverted polymer-containing OLEDs cannot be readily fabricated using the vacuum deposition technology that is readily available for preparing OLEDs. The protective cap layer is typically comprised of a crystalline organic layer that protects the underlying hole conducting material from damage incurred during sputter deposition of the ITO anode. The present invention is, thus, directed to OLEDs having organic layers that can be fabricated entirely from vacuum-deposited materials. Moreover, the present OLEDs are comprised of vacuum-deposited molecular organic materials that contain a crystalline organic layer that may serve not only to protect the underlying hole transporting material from damage incurred during sputter deposition of the ITO anode but such a layer may also serve as a hole injection enhancement layer. A vacuum-deposited material is one which can be deposited in a vacuum typically having a background pressure less than one atmosphere, preferably about $10^{-5}$ to about $10^{-11}$ torr for vacuum deposition, or about 50 Torr to about $10^{-5}$ torr for vapor deposition.

The OLEDs of the present invention may also include doped layers such as disclosed in S. A. VanSlyke et al., *Appl. Phys. Lett* 70, 1665 (1997) and Tang et al., *J. Appl. Phys.* 64, 3610 (1989), which are incorporated herein by reference.

Thus, while there may be substantial variation in the type, number, thickness and order of the layers that are present, dependent on whether the device includes a single heterostructure or a double heterostructure, whether the device is a stacked OLED or a single OLED, whether an inverted sequence of OLED layers is present, whether the OLED is intended to produce emission in a preferred spectral region, or whether still other design variations are used, the present invention is directed to those devices in which the OLED is comprised of a heterostructure for producing electroluminescence which has a hole injection enhancement layer between the hole transport layer and the ITO anode layer. The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996); "Novel Materials for Multicolor LED's", Attorney Docket No. 10020/24 (filed May 2, 1997); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (LED's)", Ser. No. 08/774,087 (filed Dec. 23, 1996); "Driving Circuit For Stacked Organic Light Emitting Devices", Ser. No. 08/792,050 (filed Feb. 3, 1997); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997); "High Contrast Transparent Organic Light Emitting Device Display", Ser. No. 08/821,380 (filed Mar. 20, 1997); "Organic Light Emitting Devices Containing A Metal Complex of 5-Hydroxy-Quinoxaline as A Host Material", Ser. No. 08/838,099 (filed Apr. 14, 1997); "Light Emitting Devices Having High Brightness", Ser. No. 08/844,353 (filed Apr. 18, 1997); "Organic Semiconductor Laser", Attorney Docket No. 10020/23 (filed May 19, 1997); and "Saturated Full Color Stacked Organic Light Emitting Devices", Attorney Docket No. 10020/22 filed on May 20, 1997, each co-pending application being incorporated herein by reference in its entirety. The subject invention may also be used in conjunction with the subject matter of each of co-pending U.S. patent application Ser. Nos. 08/354,674, 08/613,207, 08/632,322 and 08/693,359 and provisional patent application Ser. Nos. 60/010,013, 60/024,001 and 60/025,501, each of which is also incorporated herein by reference in its entirety.

This invention will now be described in detail with respect to showing how certain specific representative embodiments thereof will be made, the materials, apparatus and process steps being understood as examples that are intended to be illustrative only. In particular, the invention is not intended to be limited to the methods, materials, conditions, process parameters, apparatus and the like specifically recited herein.

EXAMPLES

Prior to the deposition of the organic films for the representative IOLEDs of the present invention, (100) Si substrates were cleaned by sequential ultrasonic rinses in detergent solution and deionized water, then boiled in 1,1,1-trichloroethane, rinsed in acetone, and finally boiled in 2-propanol. Between each cleaning step, the substrates were dried in high purity nitrogen. The background pressure prior to deposition was normally $7 \times 10^{-7}$ torr or lower and the pressure during the deposition was about $5 \times 10^{-7}$ to $1.1 \times 10^{-6}$ torr.

The IOLED structure (FIG. 1) was grown starting with the thermal evaporation in vacuum of a 1000 Å thick cathode consisting of 25:1 Mg-Ag alloy, followed by a 500 Å thick aluminum tris(8-hydroxyquinoline) (Alq$_3$) electron transporting and electroluminescent (EL) layer, and a 250 Å thick hole transporting layer (HTL) of N,N'-diphenyl-N,N'-bis(3-methylphenyl)-1,1'-biphenyl-4,4'-diamine (TPD). Alternatively, IOLEDs employing 4,4'-bis[N-(1-napthyl)-N-phenyl-amino]biphenyl ($\alpha$-NPD) as the HTL were also fabricated, with results similar to those obtained using TPD. To protect the fragile HTL from the sputter deposition of the top ITO anode contact, either a 3,4,9,10-perylenetetracarboxylic dianhydride (PTCDA) or a copper phthalocyanine (CuPc) film was employed.

Typical organic deposition rates ranged from 1 Å/s to 5 Å/s with the substrate held at room temperature. Finally, the top ITO layer was deposited by RF magnetron sputtering of a pressed ITO target in a 2000:1 Ar:O$_2$ atmosphere, and 5 mTorr pressure. The RF power was 5W, which resulted in a deposition rate of 200 Å/hour.

Figure 2:
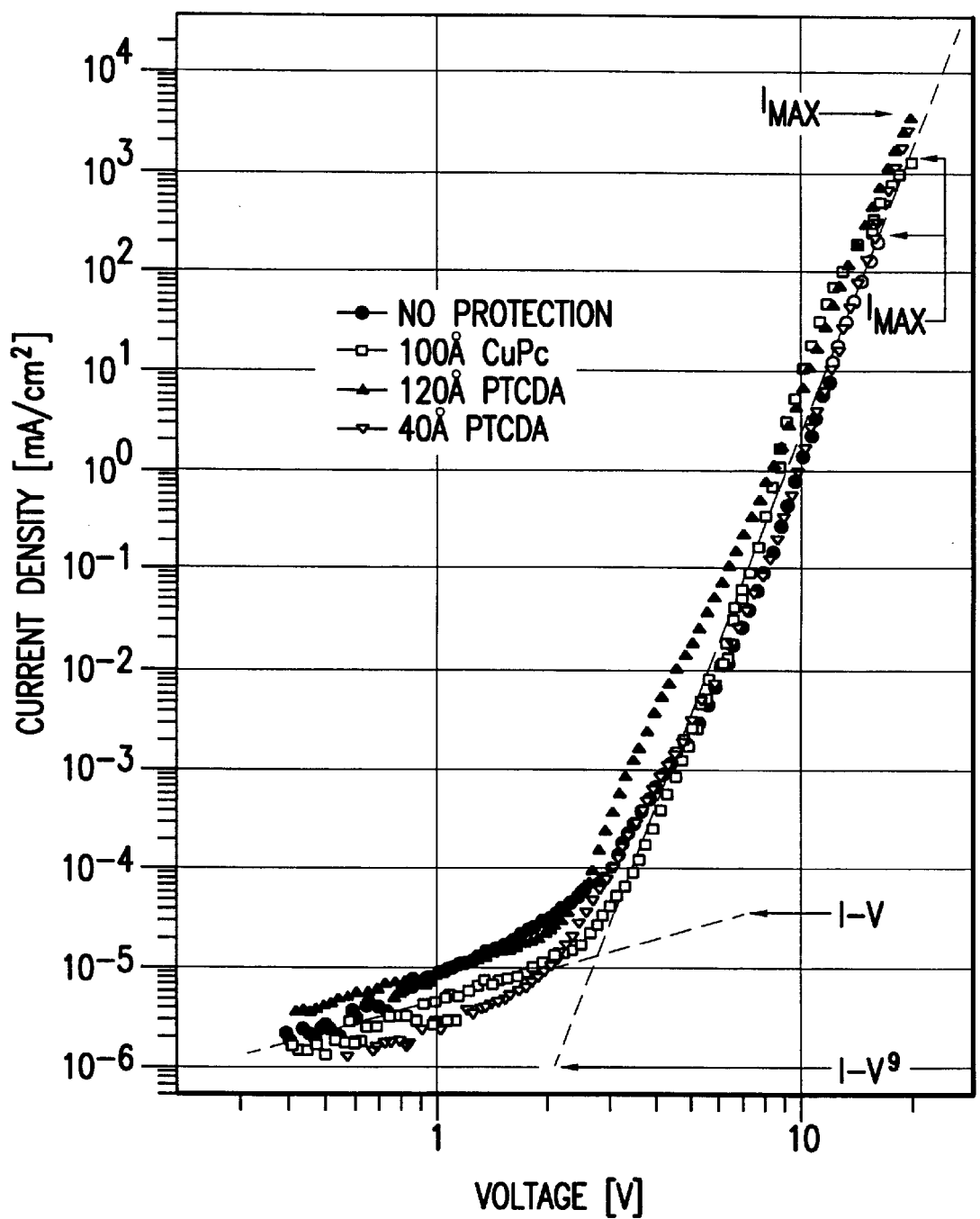
FIG. 2 shows the forward bias current-voltage (I–V) characteristics of 0.05 mm IOLEDs with PTCDA and CuPc PCLs, which function as hole injection enhancement layers, and of a device with no PCL.

The forward bias current-voltage (I–V) characteristics of 0.05 mm$^2$ IOLEDs with PTCDA and CuPc PCLs, as well as of a device with no PCL are shown in FIG. 2. These characteristics are similar to previously reported conventional IOLEDs, where trap limited conduction was observed, Z. Shen et al., Jpn. J. Appl. Phys. 35, L401 (1996), P. E. Burrows J. Appl. Phys. 79, 7991 (1996), ($I \alpha V^{(m+1)}$). For the IOLEDs, m=8 independent of the details of the particular device structure or PCL thickness. The EL brightness at a current density of 10 mA/cm$^2$ was between 40 and 100 cd/m$^2$ for all devices, independent of details of the HTL, PCL or anode structure. The IOLEDs, whose characteristics are presented in FIG. 2, are a representative sample of devices with different thicknesses of PTCDA or CuPc. The operating voltage of IOLEDs employing CuPc as the PCL was independent of CuPc thickness between 40 Å and 170 Å. In contrast, the operating voltage of PTCDA-protected IOLEDs abruptly decreased by 1.5 V as the PTCDA thickness increased from 40 Å to 60 Å. The voltage drop across the PCL is typically small compared to that across the rest of the device, since PTCDA and CuPc are both thinner and more conductive. Therefore, the abrupt change in the I–V characteristics reflects a change in the hole injection efficiency from the ITO contact.

While not intending to be limited to the precise theory of how the hole injection efficiency is enhanced for OLEDs containing a PCL, the enhancement is believed to be partly due to the reduced damage of the vacuum deposited hole transport layer during deposition of the ITO layer and partly due to a reduced barrier for hole injection from ITO into the hole injection enhancement layer. The ITO sputter deposition typically inflicts film damage to the top-most organic layer. This damage results in only a 30% yield out of 15 devices with no PCL, as compared to 100% yield for devices with either a PTCDA or CuPc PCL. The abrupt increase in the operating voltage for IOLEDs with <40 Å thick PTCDA layers occurs when the thickness of the damaged region is comparable to the PCL thickness. At this point, further deposition of ITO degrades the TPD which becomes directly exposed to the sputtering plasma.

The presence of the PCL also influences the maximum drive current before device breakdown ($I_{max}$), where $I_{max}$ for an IOLED with no PCL is only 10% of that obtained for IOLEDs with either a PTCDA or CuPc PCL. The differences in $I_{max}$ are evident in both FIGS. 2 and 3, where all IOLEDs were driven at continuously higher currents until device breakdown occurred.

The PCL is, therefore, shown herein to protect the underlying organic materials, to decrease the IOLED operating voltage, and to increases $I_{max}$ of the IOLEDs prepared containing the PCL. A similar decrease in the operating voltage was previously observed for conventional OLEDs with a CuPc coated ITO anode, S. A. VanSlyke et al., *Appl. Phys. Lett* 69, 2160 (1996). This is believed to be due to a reduced energy barrier to hole injection from the ITO into CuPc as opposed to the energy barrier between the ITO and the HTL. The lowest transition voltage (i.e. the voltage at which ohmic conduction and trap limited conduction are equal) was achieved for IOLEDs with >100 Å thick PTCDA PCLs. These results show an enhanced hole injection efficiency as compared with IOLED devices not including the PCL.

Figure 3:
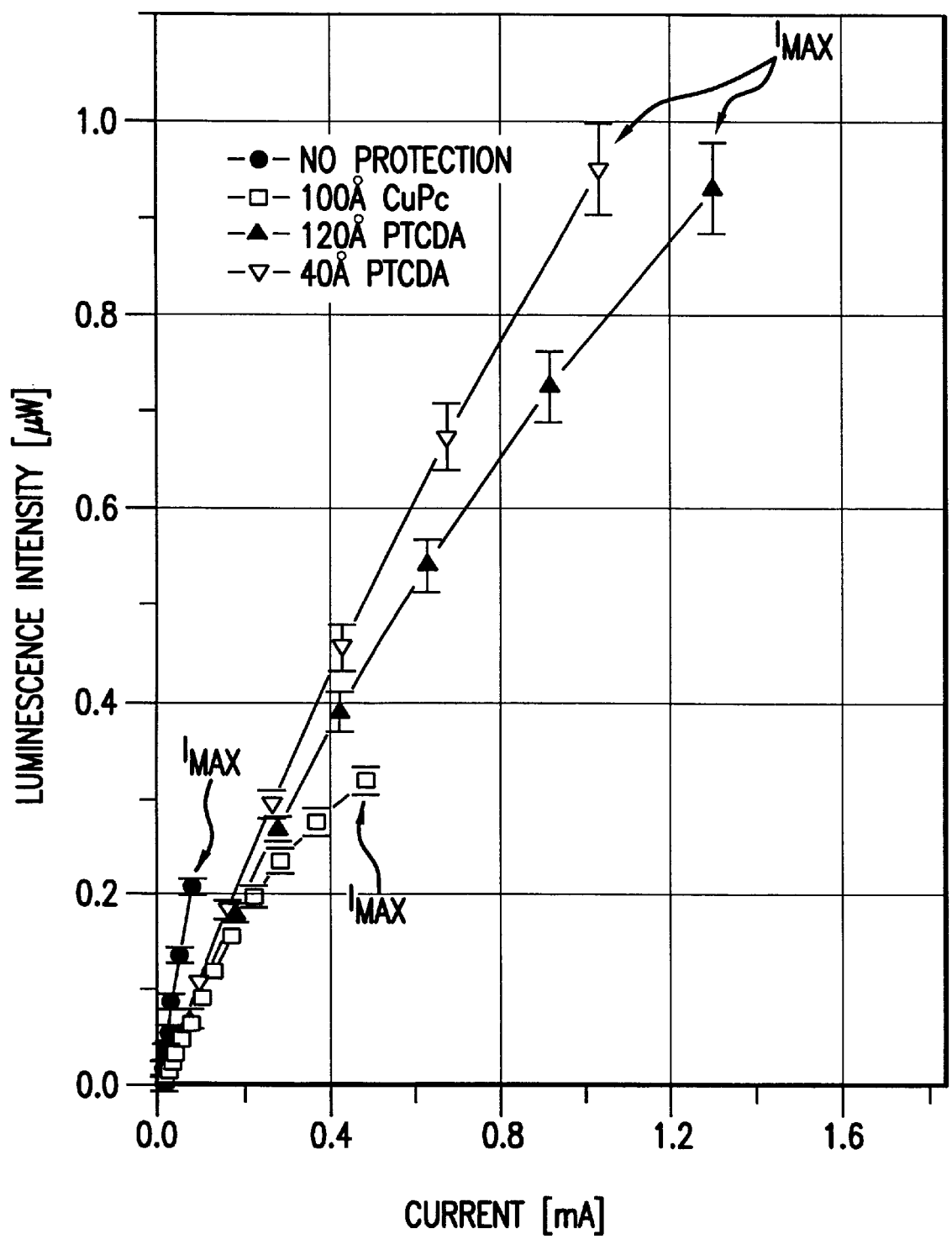
FIG. 3 shows the luminescence intensity vs. current (L–I) of the IOLEDs in FIG. 2.
Figure 4:
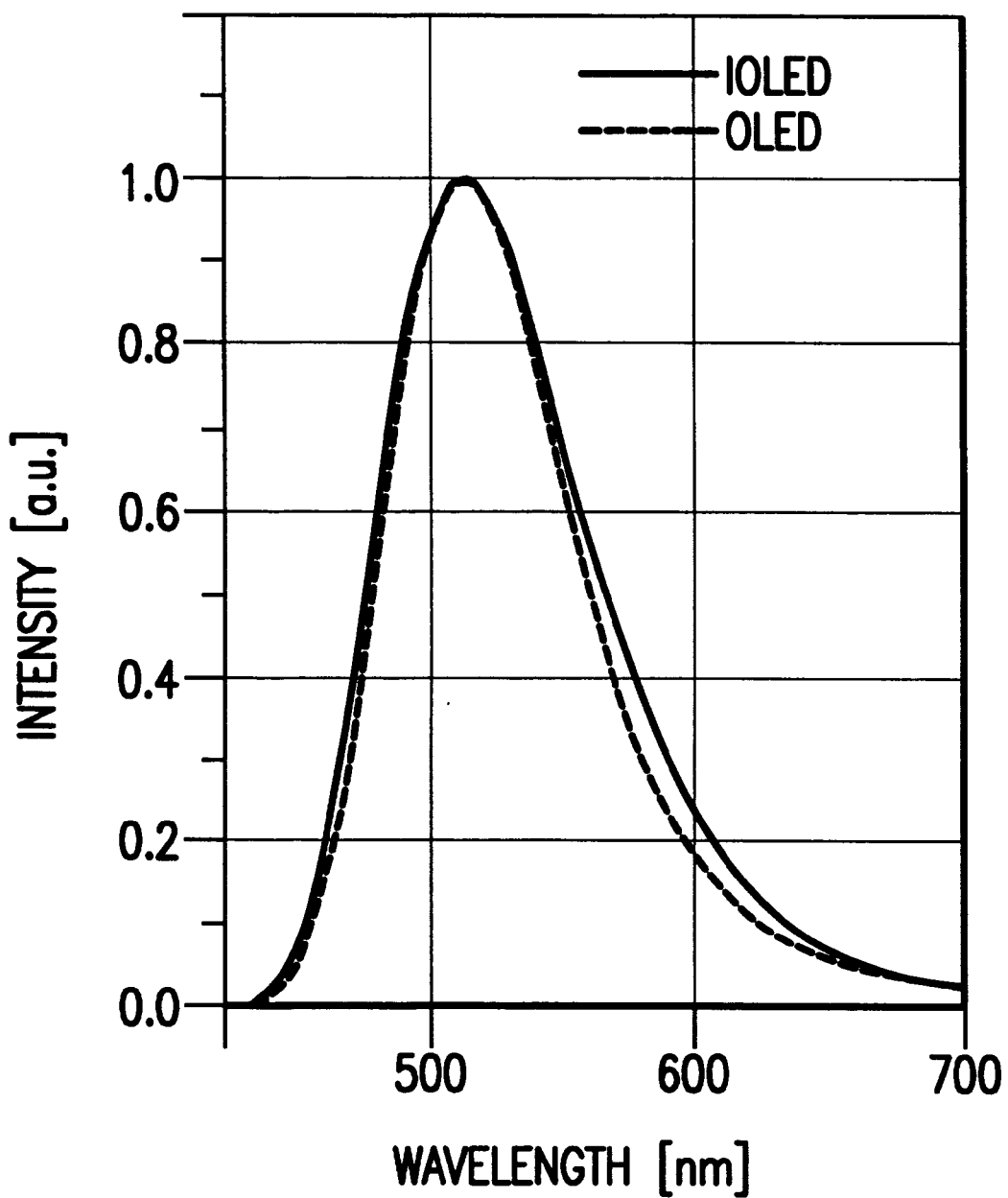
FIG. 4 shows the I–V characteristics of the shape of the EL emission spectra of IOLEDs with hole injection enhancemnet layers as compared to that of conventional $Alq_3$-based OLEDs not having the hole injection enhancement layer.

FIG. 3 shows the light intensity vs. current (L–I) response of the IOLEDs in FIG. 2. The external EL quantum efficiency of the protected IOLEDs was $\eta=(0.15 \pm 0.01)\%$ vs. $\eta=(0.30\pm0.02)\%$ for the unprotected devices. This difference is believed to be due in part to absorption by the PCL, since both CuPc and PTCDA exhibit a strong absorption at the peak $Alq_3$ emission wavelength of 530 nm. For example, $\eta$ decreases by 25% as the CuPc PCL thickness increases from 40 Å to 170 Å. Similarly, $\eta$ for PTCDA-protected IOLEDs decreases by 25% with an increase in PTCDA film thickness from 10 Å to 120 Å, consistent with PTCDA absorption. The origin of the remaining difference in $\eta$ between IOLEDs with and without a PCL is not understood, although it is believed that defects at the PTCDA/ITO interface may scatter a fraction of the emitted light back into the PTCDA where it can experience further absorption. A different PCL material, some of which are described above, which is transparent to $Alq_3$ emission is thus expected to increase the IOLED efficiency somewhat. The shape of the EL emission spectra of IOLEDs with PCLs is similar to that of conventional $Alq_3$-based OLEDs (FIG. 4). The IOLED spectrum with a 60 Å thick PTCDA PCL is slightly broadened due to the PCL absorption.

Figure 5:
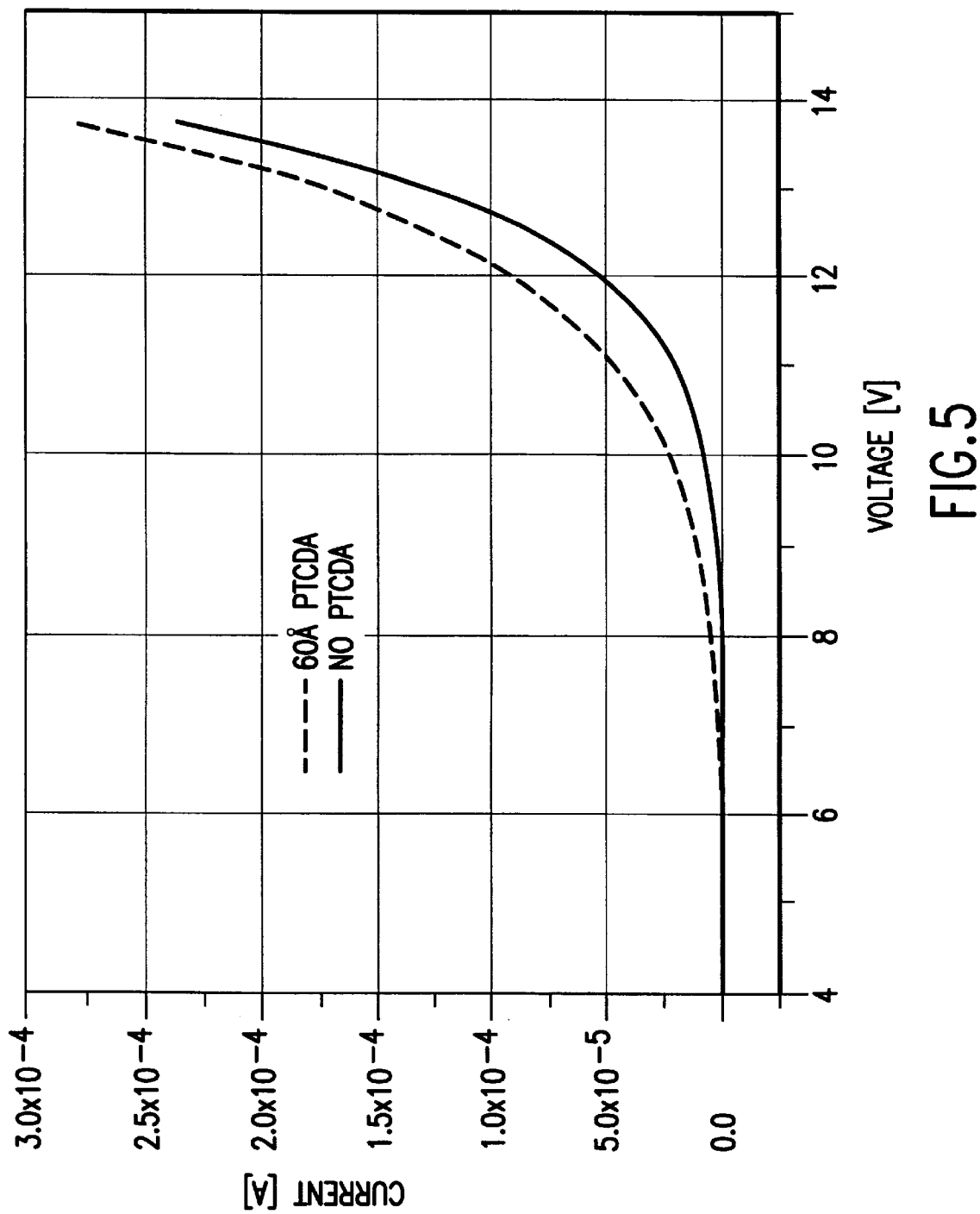
FIG. 5 shows the current vs. voltage of an OLED with and without a 60 Å PTCDA layer between an ITO anode layer and an NPD hole transporting layer.

An OLED was also prepared comprised of structure having the following sequence of layers: an ITO layer/60 Å PTCDA/500 Å NPD/500 Å Alq$_3$/1000 Å MgAg/500 Å Ag and a similar OLED, but without the PTCDA layer. The current vs. voltage of this device is shown in FIG. 5.

These results show that a surface-emitting, or organic inverted LED (IOLED) with a cathode as a bottom contact and using a novel anode comprised of an organic hole-injecting PCL and a transparent, sputter-deposited ITO thin film could produce enhanced hole injection efficiency as compared with IOLEDs lacking such a PCL. The IOLED can be grown on top of any smooth substrate to which the cathode will adhere, including opaque substrates such as Si and metal foils. The IOLED I–V characteristics and EL spectra were similar to that of conventional OLEDs, while the operating voltage is higher and efficiency somewhat decreased, indicating the need for further optimization of the device contacts.

Those of skill in the art may recognize certain modifications to the various embodiments of the invention, which modifications are meant to be covered by the spirit and scope of the appended claims.

What is claimed is:

1. An organic light emitting device comprising:
    a heterostructure for producing electroluminescence comprised of a hole injection enhancement layer between a hole transporting layer and an anode layer, wherein the hole injection enhancement layer is formed of a compound selected from a group consisting of 3,4,9,10-perylenetetracarboxylic dianhydride; 3,4,7,8-naphthalenetetracarboxylic dianhydride; 3,4,9,10-perylenetetracarboxylic dianhydride; bis(1,2,5-thiadiazolo)-p-quinobis(1,3-dithiole); 1,4,5,8-naphthalenetetracarboxylic dianhydride;

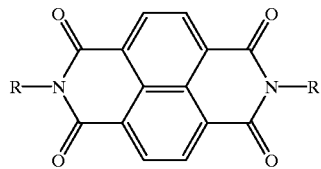

where R=H, alkyl or aryl;

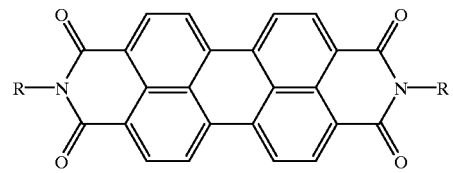

where R=H, alkyl or aryl;

a compound having the CA index name, bisbenzimidazo [2,1-a:1',2'-b']anthra[2,1,9-def:6,5,10-d'e'f'] diisoquinoline-10,21-dione;

a compound having the CA index name, bisnaphth[2',3':4,5]imidazo[2,1-a:2',1'-a']anthra[2,1,9-def:6,5,10-d'e'f'] diisoquinoline-10,21-dione;

a compound having the CA index name, bisbenzimidazo [2,1-b:2',1'-i]benzo[lmn][3,8]phenanthroline-8,1-dione;

a compound having the CA index name, benzo[lmn] bisnaphth[2',3':4,5]imidazo[2,1-b:2',1'-I][3,8] phenanthroline-9,20-dione;

or a substituted derivative of one of said compounds.

2. The organic light emitting device of claim 1 wherein the hole injection enhancement layer is comprised of 3,4,9,10-perylenetetracarboxylic dianhydride.

3. The organic light emitting device of claim 1 wherein said hole transporting layer is comprised of 4,4'-bis[N-(1-napthyl)-N-phenyl-amino]biphenyl.

4. The organic light emitting device of claim 1 wherein said electron transporting layer is comprised of aluminum-tris(8-hydroxyquinoline).

5. The organic light emitting device of claim 1 further comprising a cathode comprised of a Mg-Ag alloy.

6. The organic light emitting device of claim 1 further comprising a cathode comprised of a Li-Al alloy.

7. The organic light emitting device of claim 1 wherein said anode is comprised of indium tin oxide.

8. A display incorporating the organic light emitting device of claim 1.

9. A vehicle incorporating the organic light emitting device of claim 1.

10. A computer incorporating the organic light emitting device of claim 1.

11. A television incorporating the organic light emitting device of claim 1.

12. A printer incorporating the organic light emitting device of claim 1.

13. A wall, theater or stadium screen incorporating the organic light emitting device of claim 1.

14. A billboard or a sign incorporating the organic light emitting device of claim 1.

15. An organic light emitting device comprising:

a heterostructure for producing electroluminescence comprised of a hole injection enhancement layer between a hole transporting layer and an anode layer, wherein the hole injection enhancement layer is comprised of 3,4,9,10-perylenetetracarboxylic dianhydride.

16. A method of fabricating an organic light emitting device for producing electroluminescence comprising:

fabricating a heterostructure for producing electroluminescence, wherein the fabrication process includes the step of depositing a hole injection enhancement layer on a hole transporting layer and then depositing an indium tin oxide anode layer on said hole injection enhancement layer, wherein the hole injection enhancement layer is selected from the group consisting of 3,4,9,10-perylenetetracarboxylic dianhydride; 3,4,7,8-naphthalenetetracarboxylic dianhydride; 3,4,9,10-perylenetetracarboxylic dianhydride; bis(1,2,5-thiadiazolo)-p-quinobis(1,3-dithiole); 1,4,5,8-naphthalenetetracarboxylic dianhydride;

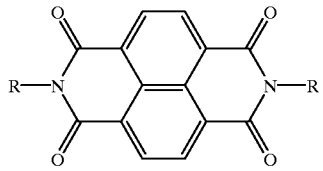

where R=H, alkyl or aryl;

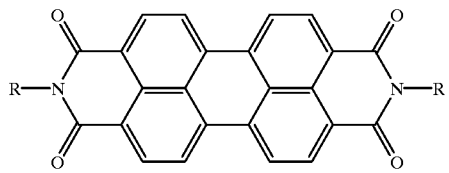

where R=H, alkyl or aryl;

a compound having the CA index name, bisbenzimidazo [2,1-a:1',2'-b']anthra[2,1,9-def:6,5,10-d'e'f'] diisoquinoline-10,21-dione;

a compound having the CA index name, bisnaphth[2',3':4,5]imidazo[2,1-a:2',1'-a']anthra[2,1,9-def:6,5,10-d'e'f'] diisoquinoline-10,21-dione;

a compound having the CA index name, bisbenzimidazo [2,1-b:2',1'-i]benzo[lmn][3,8]phenanthroline-8,1-dione;

a compound having the CA index name, benzo[lmn] bisnaphth[2',3':4,5]imidazo[2,1-b:2'1'-I][3,8] phenanthroline-9,20-dione;

or a substituted derivative of one of said compounds.

17. The method according to claim 16 wherein said hole injection enhancement layer is comprised of 3,4,9,10-perylenetetracarboxylic dianhydride.

* * * * *